(12) United States Patent
Kubota

(10) Patent No.: US 6,806,028 B2
(45) Date of Patent: Oct. 19, 2004

(54) PHOTOSENSITIVE CONDUCTIVE PASTE, METHOD FOR FORMING CONDUCTIVE PATTERN USING THE SAME, AND METHOD FOR MANUFACTURING CERAMIC MULTILAYER ELEMENT

(75) Inventor: Masahiro Kubota, Otsu (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 146 days.

(21) Appl. No.: 10/213,093

(22) Filed: Aug. 7, 2002

(65) Prior Publication Data

US 2003/0036020 A1 Feb. 20, 2003

(30) Foreign Application Priority Data

Aug. 7, 2001 (JP) ........................................ 2001-239425
Apr. 24, 2002 (JP) ........................................ 2002-122029

(51) Int. Cl.$^7$ .............................................. G03F 7/004
(52) U.S. Cl. ................. 430/270.1; 430/281.1; 430/311
(58) Field of Search .......................... 430/280.1, 281.1, 430/270.1, 198, 15, 16, 280, 311, 322

(56) References Cited

U.S. PATENT DOCUMENTS 4,598,037 A * 7/1986 Felten ...................... 430/281.1
6,531,257 B2 * 3/2003 Kubota ...................... 430/198
2001/0033219 A1 * 10/2001 Iha et al. ...................... 336/90
2003/0143486 A1 * 7/2003 Kubota et al. ........... 430/281.1

FOREIGN PATENT DOCUMENTS

| JP | 05-287221 | 11/1993 |
| JP | 06-224538 | 8/1994 |
| JP | 08-227153 | 9/1996 |
| JP | 08-335757 | 12/1996 |
| JP | 09-218508 | 8/1997 |
| JP | 09-218509 | 8/1997 |
| JP | 09-222723 | 8/1997 |
| JP | 10-171107 | 6/1998 |

* cited by examiner

*Primary Examiner*—Barbara Gilliam
(74) *Attorney, Agent, or Firm*—Dickstein, Shapiro, Morin & Oshinsky, LLP.

(57) ABSTRACT

Provided is a photosensitive conductive paste that is unlikely to gel, has superior storage stability and adhesion to a substrate, and can be formed into a fine and thick pattern. In a photosensitive conductive paste containing a powdered base metal, an organic binder having acidic groups and a photosensitive organic component, a powdered base metal processed by surface oxidation treatment and a material such as a polyvalent alcohol having at least four hydroxyls, which forms microgels by reaction with metal hydroxides present on the surface of the powdered base metal, is used.

20 Claims, 3 Drawing Sheets

PHOTOSENSITIVE CONDUCTIVE PASTE, METHOD FOR FORMING CONDUCTIVE PATTERN USING THE SAME, AND METHOD FOR MANUFACTURING CERAMIC MULTILAYER ELEMENT

BACKGROUND OF THE INVENTION

1. Field of the Invention

The present invention relates to photosensitive conductive pastes which are primarily used for forming desired conductive patterns (circuit patterns, electrode patterns, or the like) on substrate surfaces or ceramic layers forming ceramic multilayer elements when circuit elements, ceramic multilayer elements or the like are formed, to methods for forming conductive patterns using the photosensitive conductive pastes, and to methods for manufacturing ceramic multilayer elements.

2. Description of the Related Art

Recently, concomitant with miniaturization of mobile communication apparatuses, satellite broadcast receivers, computers and the like, miniaturization and improved performance of high-frequency electronic elements used for the apparatuses mentioned above have also been progressing, and in addition, wiring patterns of high-frequency electronic circuit elements have been increasingly required to have higher wiring density and higher signal transmission speed.

In response to the requirements of the higher wiring density and higher signal transmission speed, finer wiring pattern and larger thickness (increase in thickness) thereof must be achieved.

For forming wiring patterns of high-frequency electronic elements, a method is generally used in which a pattern is formed on an insulating substrate using a conductive paste composed of a powdered polyvalent metal such as copper and an organic vehicle such as an organic binder or an organic solvent, and is then dried and fired to form a predetermined wiring pattern.

When wiring patterns are formed, screen printing has generally been used. However, when a fine wiring pattern is formed by using this method, it has been difficult to decrease the wire width and the space between wires (wire pitch) to 50 $\mu$m or less, and in general, it has been understood that the limitation of microfabrication of the wire width and the wire pitch by screen printing is 50 $\mu$m.

In contrast, in Japanese Unexamined Patent Application Publication Nos. 5-287221, 8-227153, and the like, methods in which fine and thick wires are formed by a photolithographic method using a photosensitive conductive paste have been disclosed. In these methods, a photosensitive conductive paste containing a powdered conductive metal, an acrylic copolymer having carboxyl groups and ethylenic unsaturated groups in the side chains thereof, a photoreactive material, a photopolymerization initiator, and the like is applied to an insulating substrate and is then dried, and subsequently, patterning is performed for the film thus formed by a photolithographic method including exposure and development treatment.

In addition, in Japanese Unexamined Patent Application Publication Nos. 6-224538, 8-335757, and the like, methods in which fine and thick wires are formed by a photolithographic method using a photosensitive conductive paste containing powdered glass have been disclosed. In these methods, powdered glass is contained in the photosensitive conductive paste so as to improve the adhesion between the conductive pattern and ceramic.

Recently, it has been increasingly desired in photolithographic methods using photosensitive conductive pastes that development be performed using water or an aqueous alkaline solution in consideration of environmental conservation, and accordingly, an organic binder having acidic groups, such as carboxyl groups, which liberate protons has been used. However, when the organic binder as described above is used and a polyvalent metal, in particular copper, is used as a conductive component in the photosensitive conductive paste, copper ions which dissolve out in the solution component (primarily composed of an organic solvent) of the paste react with anions of the organic binder, which are formed after protons are liberated therefrom, and as a result, a three-dimensional network may be formed by ionic cross-linking, thereby facilitating gelation of the photosensitive conductive paste. When the photosensitive conductive paste gels, in addition to difficult application thereof, a problem of unstable development may arise even when application can be preformed.

In addition, when the photosensitive conductive paste containing the acrylic copolymer having ethylenic unsaturated groups in the side chains is used, sensitivity to exposing light is increased; however, when an unsaturated glycidyl compound is used for forming ethylenic unsaturated groups in the side chains by an addition reaction, since hydroxyl groups which facilitate gelation are formed, a problem in that gelation more easily occurs may arise.

As methods for preventing gelation, for example, a phosphorous compound such as phosphoric acid, a compound having an azole structure such as benzotriazole, and an organic compound having a carboxyl group such as acetic acid have been disclosed, respectively, in Japanese Unexamined Patent Application Publication Nos. 9-218509, 9-218508, and 9-222723 as a gelation inhibitor contained in a photosensitive conductive paste. However, the methods using these gelation inhibitors may only prolong the time for gelation of the photosensitive paste to some extent, and even when these gelation inhibitors are present, difficulties in use of photosensitive conductive pastes have not been solved in practice.

Furthermore, a method has been disclosed in Japanese Unexamined Patent Application Publication No. 10-171107 in which 3-methyl-3-methoxybutanol is used as an organic solvent for preventing gelation. However, a phenomenon similar to gelation occurs in the paste in a dry state, that is, a three-dimensional network is formed by ionic cross-linking, and as a result, the substantial molecular weight is increased. Accordingly, a problem in which non-exposed areas are difficult to dissolve out in a developing solution may arise in some cases.

SUMMARY OF THE INVENTION

The present invention was made to solve the problems described above. Accordingly, an object of the present invention is to provide a photosensitive conductive paste having superior storage stability and adhesion to a substrate, which is unlikely to gel and can be formed into a fine and thick conductive pattern. In addition, another object of the present invention is to provide a method for manufacturing a conductive pattern using the photosensitive conductive paste described above and a method for manufacturing a ceramic multilayer component.

To these ends, the photosensitive conductive paste of the present invention comprises: (a) a powdered base metal processed by surface oxidation treatment; (b) an organic binder having acidic groups; (c) a photosensitive organic component; and (d) a material for forming microgels by reaction with metal hydroxides present on the surface of the powdered base metal.

Since the material for forming microgels by reaction with metal hydroxides present on the surface of the powdered base metal is contained in the photosensitive conductive paste of the present invention, in addition to the powdered base metal processed by surface oxidation treatment, gelation of the paste before application and gelation of the film obtained therefrom by application and drying can be sufficiently suppressed. Accordingly, a fine and thick conductive pattern (such as a circuit or an electrode) can be efficiently manufactured.

The reasons gelation can be prevented in the photosensitive conductive paste of the present invention are believed to be that:

(1) the activity of metal hydroxides present on the surface of the powdered base metal is low since the surface thereof is processed by oxidation; and (2) material present on the surface of the powdered base metal forms microgels with the metal hydroxides present on the surface of the powdered base metal by complex formation, and these microgels have a steric hindrance effect, thereby interfering with formation of bonds between the powdered base metal and the acidic groups of the organic binder.

DESCRIPTION OF THE PREFERRED EMBODIMENTS

The photosensitive conductive paste of the present invention comprises the powdered base metal processed by surface oxidation treatment; the organic binder having acidic groups; the photosensitive organic component; and a material for forming microgels by reaction with metal hydroxides present on the surface of the powdered base metal.

In this embodiment, the metal hydroxides present on the surface of the powdered base metal are primarily formed by reaction between metal oxides formed by surface oxidation treatment of the powdered base metal and moisture in an air atmosphere. For example, when the powdered base metal is copper (Cu) particles, a metal oxide such as CuO or $Cu_2O$ is formed on the surface of the Cu particles. Next, by reaction with $H_2O$ in the atmosphere, the metal oxide on the surface of the Cu particles is converted into a metal hydroxide, such as CuOH or $Cu(OH)_2$. This metal hydroxide reacts with a material which forms microgels by reaction therewith, to form microgels in accordance with complex formation. Since these microgels exhibit a steric hindrance effect, gelation caused by the reaction between the acidic groups of the organic binder and the powdered base metal can be prevented.

In the photosensitive conductive paste of the present invention, the organic binder having acidic groups has a broad scope including an organic binder formed of a material having groups, such as a carboxyl group, a hydroxyl group and a sulfonic group, which liberate protons or an organic binder containing a material having the groups mentioned above, and the type of acidic group is not been specifically limited.

The photosensitive organic component used for forming the photosensitive conductive paste of the present invention includes a known photopolymerizable or a photomodifiable compound. For example, there may be mentioned:

(1) a mixture of a monomer or an oligomer having a reactive group such as an unsaturated group and a photoradical generator such as an aromatic carbonyl compound;

(2) a so-called diazo resin such as a condensate of an aromatic bisazide and formaldehyde;

(3) a mixture of an addition polymerizable compound such as an epoxy compound and a photoacid generator such as a diaryliodonium salt; or (4) a naphthoquinonediazide compound.

Among those mentioned above, the mixture composed of a monomer or an oligomer having a reactive functional group, such as an unsaturated group, and a photoradical generator such as an aromatic carbonyl compound is particularly preferable.

As the photoradical generator mentioned above, for example, there may be mentioned benzil, benzoin ethyl ether, benzoin isobutyl ether, benzoin isopropyl ether, benzophenone, benzoylbenzoate, methyl benzoylbenzoate, 4-benzoyl-4'-methyl diphenyl sulfide, benzyl dimethyl ketal, 2-n-butoxy-4-dimethyl aminobenzoate, 2-chlorothioxanthone, 2,4-diethyl thioxanthone, 2,4-diisopropyl thioxanthone, isopropyl thioxanthone, 2-dimethyl aminoethyl benzoate, p-dimethyl ethyl aminobenzoate, p-dimethyl isoamyl aminobenzoate, 3,3'-dimethyl-4-methoxy benzophenone, 2,4-dimethyl thioxanthone, 1-(4-dodecylphenyl)-2-hydroxy-2-methyl propane-1-one, 2,2-dimethoxy-1,2-diphenylethane-1-one, hydroxycyclohexyl phenyl ketone, 2-hydroxy-2-methyl-1-phenylpropane-1-one, 1-[4-(2-hydroxyethoxy)-phenyl]-2-hydroxy-2-methyl-1-propane-1-one, 2-methyl-1-[4-(methylthio)phenyl]-2-morpholinopropane-1-one, methylbenzoyl formate, 1-phenyl-1,2-propanedione-2-(o-ethoxycarbonyl)oxime, 2-benzyl-2-dimethylamino-1-(4-morpholinophenyl)-1-butanone, bis(2,6-dimethoxybenzoyl)-2,4,4-trimethylpentylphosphine oxide, or bis(2,4,6-trimethyl benzoyl)-phenylphosphine oxide.

As the monomer or the oligomer having a reactive functional group, mentioned above, for example, there may be mentioned hexanediol triacrylate, tripropylene glycol triacrylate, trimethylolpropane triacrylate, stearyl acrylate, tetrahydrofurfuryl acrylate, lauryl acrylate, 2-phenoxyethyl acrylate, isodecyl acrylate, isooctyl acrylate, tridecyl acrylate, caprolactone acrylate, ethoxylated nonyl phenol acrylate, 1,3-butanediol diacrylate, 1,4-butanediol diacrylate, diethylene glycol diacrylate, tetraethylene glycol diacrylate, triethylene glycol diacrylate, ethoxylated bisphenol A diacrylate, propoxylated neopentyl glycol diacrylate, tris(2-hydroxyethyl)isocyanurate triacrylate, ethoxylated trimethylolpropane triacrylate, pentaerythritol triacrylate, propoxylated trimethylolpropane triacrylate, propoxylated glycerol triacrylate, pentaerythritol tetraacrylate, ditrimethylolpropane tetraacrylate, dipentaerythritolhydroxy pentaacrylate, ethoxylated pentaerythritol tetraacrylate, tetrahydrofurfuryl methacrylate, cyclohexyl methacrylate, isodecyl methacrylate, lauryl methacrylate, triethylene glycol dimethacrylate, ethylene glycol dimethacrylate, tetraethylene glycol dimethacrylate, 1,4-butanediol dimethacrylate, diethylene glycol dimethacrylate, 1,6-hexanediol dimethacrylate, neopentyl glycol dimethacrylate, 1,3-butylene glycol dimethacrylate, ethoxylated bisphenol A dimethacrylate, or trimethylolpropane triacrylate.

It is preferable that an ultraviolet absorber be further present in the photosensitive conductive paste of the present invention. When an ultraviolet absorber is present, exposure defects caused by light scattering can be reduced to as small as possible. As the ultraviolet absorber mentioned above, an azo-based red pigment, or an amine-based red dye may be mentioned by way of example.

In order to improve the adhesion to the substrate, an inorganic component such as powdered glass or powdered ceramic may be present in the photosensitive conductive paste of the present invention. As the powdered glass, known powdered glass such as borosilicate glass may be used, and as the powdered ceramic, in addition to alumina or zirconia, known low-temperature sinterable powdered ceramic such as crystallized glass-based ceramic, glass composite-based ceramic or non-glass ceramic may be used.

In addition, a storage stabilizer such as a polymerization inhibitor, an oxidation inhibitor, a dye, a pigment, an anti-foaming agent, a surfactant, or the like may be optionally contained in the photosensitive conductive paste of the present invention when necessary.

The material for forming microgels by reaction with metal hydroxides present on the surface of the powdered base metal in the photosensitive conductive paste of the present invention, preferably comprises a polyvalent alcohol having at least four hydroxyl groups per molecule. When the polyvalent alcohol is present, the formation of microgels is facilitated and gelation of the photosensitive conductive paste can be suppressed or prevented.

As the polyvalent alcohol, for example, there may be mentioned threitol, erythritol, arabitol, xylitol, ribitol, adonitol, glucitol, mannitol, iditol, talitol, galactitol, malitol, perseitol and volemitol.

In addition, the material for forming microgels by reaction with metal hydroxides present on the surface of the powdered base metal preferably comprises a poly(ether ester) surfactant. When the poly(ether ester) surfactant is present, the formation of microgels is facilitated, and gelation of the photosensitive conductive paste can be suppressed or prevented. In this case, about 0.05 to 2 parts by weight of the poly(ether ester) surfactant is preferably present with respect to 100 parts by weight of the powdered base metal.

When the content of the poly(ether ester) surfactant is less than about 0.05 parts by weight, the effect of preventing gelation is hard to obtain. On the other hand, when the content is more than about 2 parts by weight, the microgels become larger, and, the photosensitive conductive paste may gel in some cases.

When the polyvalent alcohol having at least four hydroxyl groups per molecule described above and the poly(ether ester) surfactant are simultaneously present, gelation can be more effectively prevented.

In the photosensitive conductive paste of the present invention, the powdered base metal preferably comprises at least one metal selected from the group consisting of copper (Cu), molybdenum (Mo), nickel (Ni), tungsten (W) and an alloy containing at least one of the above-mentioned metals.

As the powdered base metal, various materials may be used, and in particular, Cu, Mo, Ni, W, or an alloy containing at least one of the metals mentioned above facilitates gelation. Nevertheless, according to the present invention, a photosensitive conductive paste which is sufficiently prevented from gelling and can be formed into a fine and thick conductive pattern, can be reliably obtained.

The powdered base metal is preferably in the form of a sphere, and the average particle diameter d50 and the specific surface area thereof are preferably about 1 to 5 $\mu$m and about 0.1 to 2.0 $m^2/g$, respectively. When the average particle diameter and the specific surface area are outside the ranges mentioned above, pattern formation may become difficult in some cases.

As the powdered base metal, a powdered base metal heated at room temperature or more in an oxide-containing atmosphere for surface oxidation treatment is preferably used in the photosensitive conductive paste of the present invention.

By heating a powdered base metal to room temperature or more in an oxygen-containing atmosphere, the powdered base metal processed by oxidation treatment on the surface thereof can be efficiently obtained, and as a result, the advantages of the present invention can be effectively obtained.

Of methods for processing the surface oxidation treatment of powdered base metals, the method of heating in an oxygen-containing atmosphere is preferable. Since the state of base metal oxide formed on the surface of the powdered base metal can be easily controlled, and a dense film of the base metal oxide can be formed on the powdered base metal.

In addition, the oxygen content in the powdered base metal is preferably in the range of about 0.4 to 1.2 wt % in the photosensitive conductive paste of the present invention. When the oxygen content is less than about 0.4 wt %, the surface of the powdered base metal cannot be sufficiently covered with the oxide, and as a result, the effect of preventing gelation may not be as much as expected in some cases. On the other hand, when the oxygen content is more than about 1.2 wt %, the base metal oxide film becomes brittle, and as a result, the effect of preventing gelation may not be as much as expected in some cases.

The organic binder having acidic groups is preferably an acrylic copolymer having carboxyl groups in the photosensitive conductive paste of the present invention. When an acrylic copolymer having carboxyl groups is used as the organic binder, while gelation is suppressed, and development can be performed by using water or an aqueous alkaline solution. In addition, the organic binder mentioned above may be effectively used as a photosensitive organic binder.

An acrylic copolymer (organic binder) having carboxyl groups may be formed by, for example, copolymerizing an unsaturated carboxylic acid and an ethylenic unsaturated compound. As an unsaturated carboxylic acid, there may be mentioned acrylic acid, methacrylic acid, maleic acid, fumaric acid, vinyl acetic acid, the anhydrides thereof, or the like. In addition, as an ethylenic unsaturated compound, there may be mentioned an acrylic ester, such as methyl acrylate or ethyl acrylate; a methacrylic ester, such as methyl methacrylate or ethyl acrylate; or a fumaric ester such as monoethyl fumarate; or the like.

In addition, as the acrylic copolymer, a material having unsaturated bonds in the form described below may also be used.

(1) A material obtained by addition reaction between the carboxyl groups in the side chains of the acrylic copolymer described above and an acrylic monomer having a functional group, such as an epoxy group, which is reactive with the carboxyl group mentioned above.

(2) A material obtained by performing a reaction between an acrylic copolymer having epoxy groups instead of carboxyl groups (in the side chains thereof) and an unsaturated monocarboxylic acid and subsequently bonding a saturated or an unsaturated polyvalent carboxylic anhydride to the acrylic copolymer.

It is preferable that this organic binder having acidic groups be an acrylic copolymer having carboxyl groups and that unsaturated bonds be formed by an addition reaction of the carboxyl groups and an unsaturated glycidyl compound. When an organic binder is used having unsaturated bonds formed by addition reaction of carboxyl groups of an acrylic copolymer and an unsaturated glycidyl compound, the sensitivity to exposing light can be increased, and hence, the advantages of the present invention can be more effectively obtained.

When an unsaturated glycidyl compound is used for a conventional photosensitive conductive paste gelation occurs more easily since hydroxyl groups facilitating gelation are formed, and degradation of storage stability may become a problem. In contrast, since the powdered base metal processed by surface oxidation treatment is used in the photosensitive conductive paste of the present invention, and in addition, the material for forming microgels by reaction with the metal hydroxide, such as a polyvalent alcohol having at least four hydroxyls, is present, gelation of the photosensitive conductive paste can be suppressed, sufficient storage stability can be ensured, and hence, the degradation of storage stability with time cannot be a problem.

Accordingly, the amount of a glycidyl compound having an unsaturated group, which can be bonded to the acrylic copolymer in accordance with an addition reaction, is not specifically limited as long as an amount of carboxyl groups remains after the addition reaction so that the acrylic copolymer is soluble in an alkali solution (that is, soluble in a developing solution).

When unsaturated bonds are formed by an addition reaction between carboxyl groups and an unsaturated glycidyl compound, as the unsaturated glycidyl compound, as disclosed in Japanese Unexamined Patent Application Publication No. 2000-204130, an alicyclic glycidyl compound having an unsaturated group or the like may be used. As the alicyclic glycidyl compound having an unsaturated compound, 3,4-epoxycyclohexylmethyl methacrylate, 3,4-epoxycyclohexylmethyl acrylate, or a caprolactone-modified compound thereof is preferable, and of those mentioned above, 3,4-epoxycyclohexylmethyl methacrylate is most preferable.

In the photosensitive conductive paste of the present invention, it is preferable that a diol compound be further present. When a diol compound is present, the diol compound forms hydrogen bonds with metal hydroxides present on the surface of the powdered base metal and interferes with the formation of bonds between the metal hydroxides and acidic groups of the organic binder, and as a result, gelation can be more reliably suppressed.

As a preferable diol compound, for example, there may be mentioned ethylene glycol, propylene glycol, trimethylene glycol, butylene glycol, tetramethylene glycol, pentamethylene glycol, butenediol, hexamethylene glycol, heptanediol, octanediol, nonanediol, decanediol, diethylene glycol, dipropylene glycol, triethylene glycol, or tripropylene glycol.

In the photosensitive conductive paste of the present invention, it is preferable that a material having anion-absorbing properties be further present. When a polyvalent metal component is contained in the photosensitive conductive paste, the polyvalent metal component may react with the acidic groups of the organic binder to form gel in some cases. However, a material having anion-absorbing properties forms bonds with the acidic groups of the organic binder and interferes with the formation of bonds between metal hydroxides and the acidic groups in the organic binder, and hence, gelation can be more reliably suppressed.

The material having anion-absorbing properties may be in the form of inorganic or organic microparticles. As inorganic microparticles, hydroxyapatite, hydrotalcite, zirconium phosphate or hydrated antimony oxide is preferably used. In addition, as organic microparticles, anion exchange resins or the like may be used, and for example, there may be mentioned:

(1) a compound primarily composed of a copolymer formed of divinyl benzene and acrylate, methacrylate, or acrylonitrile having primary, secondary, tertiary or quaternary amino groups as ion exchange groups;

(2) a compound primarily composed of a copolymer formed of vinyl benzene and acrylate, methacrylate or acrylonitrile, having primary, secondary, tertiary or quaternary amino groups as ion exchange groups;

(3) a compound primarily composed of a copolymer formed of trimethylolpropane trimethacrylate and acrylate, methacrylate or acrylonitrile, having primary, secondary, tertiary or quaternary amino groups as ion exchange groups; and (4) a compound primarily composed of a copolymer formed of ethyleneglycol dimethacrylate and acrylate, methacrylate or acrylonitrile, having primary, secondary, tertiary or quaternary amino groups as ion exchange groups.

In particular, the material having anion-absorbing properties is preferably at least one selected from the group consisting of hydroxyapatite, hydrotalcite, zirconium phosphate, and hydrated antimony oxide.

As the material having anion-absorbing properties, various materials may be used; however, in particular, when at least one selected from the group consisting of hydroxyapatite, hydrotalcite, zirconium phosphate, and hydrated antimony oxide is used, reaction between the polyvalent metal component and the acidic groups of the organic binder can be efficiently suppressed, and hence, gelation can be more reliably suppressed.

A method for forming a conductive pattern, according to the present invention, comprises exposing and developing the photosensitive conductive paste of the present invention for forming a desired conductive pattern.

By forming a conductive pattern (in general, by steps of performing application, exposure and development of a photosensitive conductive paste followed by a step of firing the pattern thus formed) from the photosensitive conductive paste, which is unlikely to gel, of the present invention, a circuit substrate provided with a conductive pattern (such as a circuit or an electrode) having high accuracy and density, which could not be realized by a conventional photosensitive conductive paste, can be obtained.

In the present invention, the conductive pattern has a broad scope including circuits, electrodes and the like, and particular shapes and functions of the conductive pattern are not specifically limited.

In addition, a method for forming a conductive pattern, according to the present invention, comprises: a step of applying the photosensitive conductive paste of the present invention to a supporting body; a step of exposing and developing the photosensitive conductive paste for forming a predetermined pattern on the supporting body; a step of transferring the pattern formed on the supporting body to a substrate; and a step of firing the pattern. In this method for forming the conductive pattern, since the photosensitive conductive paste of the present invention is used, gelation of the photosensitive conductive paste and gelation of the film obtained therefrom by application and drying can be suppressed, and in particular, a desired pattern can be formed on the substrate by a transfer method, whereby a circuit substrate provided with a conductive pattern (such as a circuit or an electrode) having high accuracy and density, which could not be realized by a conventional photosensitive conductive paste, can be efficiently manufactured.

In addition, a circuit element of the present invention is manufactured by using the method for forming the conductive pattern according to the present invention. This circuit substrate, which is provided with thick pattern having high shape and dimensional accuracy, can be used for forming a compact and high-performance circuit element (such as a circuit substrate for use in hybrid ICs or the like).

In addition, a method for manufacturing a ceramic multilayer element according to the present invention comprises exposing and developing the photosensitive conductive paste of the present invention for forming a desired conductive pattern. That is, by forming a conductive pattern (in general, by steps of performing application, exposure, and development of a photosensitive conductive paste followed by a step of firing the pattern thus formed) from the photosensitive conductive paste of the present invention, which is unlikely to gel, a ceramic multilayer element provided with a conductive pattern (such as a circuit or an electrode) having high accuracy and density, which could not be realized by a conventional photosensitive conductive paste, can be efficiently manufactured.

A method for manufacturing a ceramic multilayer element according to the present invention comprises: a step of applying the photosensitive conductive paste of the present invention to supporting bodies; a step of exposing and developing the photosensitive conductive paste for forming predetermined patterns on the supporting bodies; a step of transferring the patterns formed on the supporting bodies to ceramic green sheets; a step of laminating the ceramic green sheets provided with the patterns thereon for forming a laminate; and a step of firing the laminate. Since the photosensitive conductive paste of the present invention is used, gelation of the photosensitive conductive paste and gelation of the film obtained therefrom by application and drying can be suppressed, and desired patterns can be formed on the ceramic green sheets by a transfer method. By firing the laminate formed of ceramic green sheets provided with the patterns, a ceramic multilayer element provided with conductive patterns (such as circuits or electrodes) having high accuracy and density, which could not be realized by a conventional photosensitive conductive paste, can be efficiently manufactured.

Next, a circuit element manufactured by steps of forming predetermined conductive patterns using the photosensitive conductive paste of the present invention will be described. In this embodiment, a chip coil will be described as the circuit element by way of example with reference to FIGS. 1 and 2.

Figure 1:
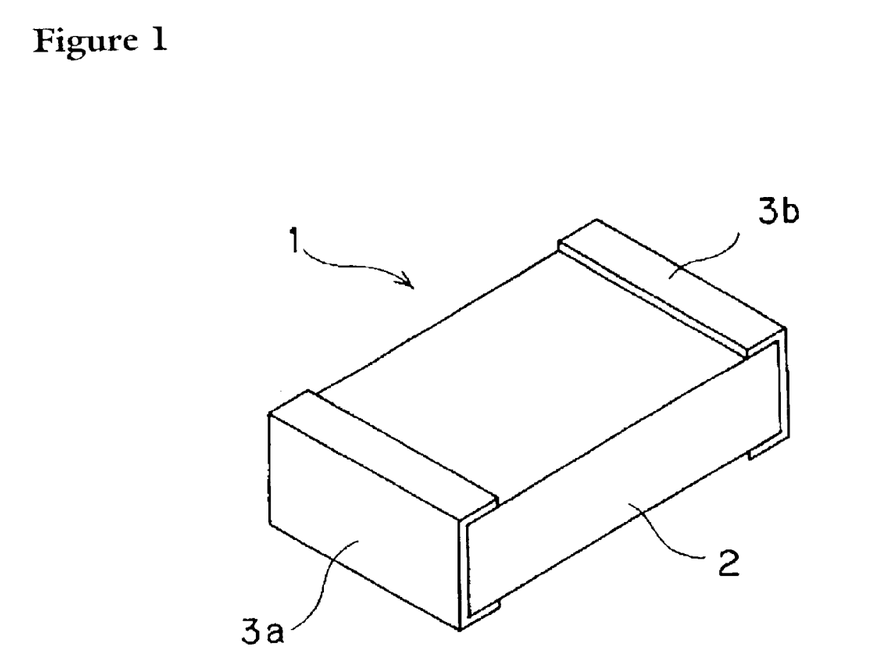
FIG. 1 is a schematic view showing a circuit substrate (chip coil) according to an embodiment of the present invention.
Figure 2:
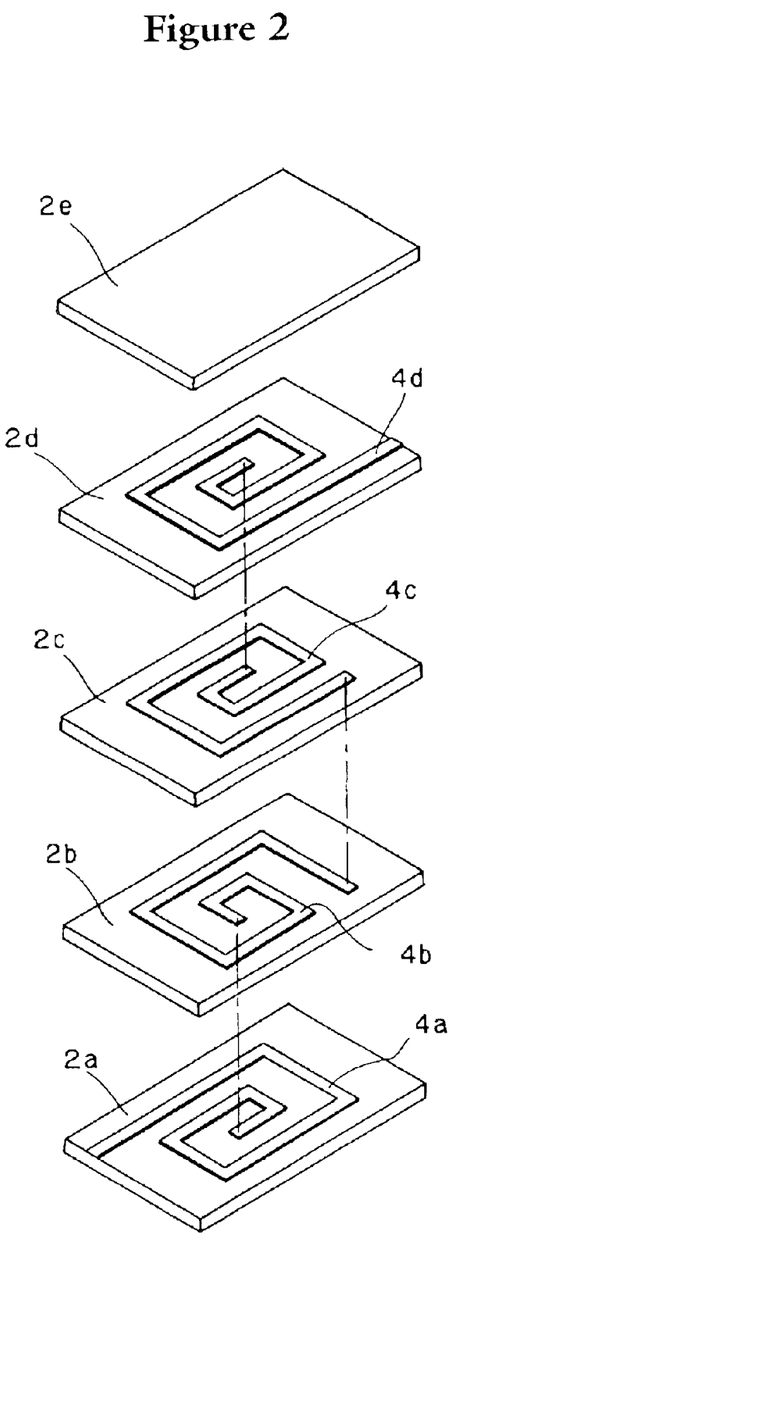
FIG. 2 is an exploded perspective view showing the structure of a circuit substrate (chip coil) according to an embodiment of the present invention.

As shown in FIG. 2, a chip coil 1 (shown in FIG. 1) has the structure comprising a laminate (laminated substrate) 2 (shown in FIG. 1) in which insulating layers 2a, 2b, 2c and 2d, which are composed of alumina or the like and are provided with corresponding internal electrodes 4a, 4b, 4c and 4d, and an insulating layer 2e which is composed of alumina or the like are sequentially laminated to each other; and external electrodes 3a and 3b (shown in FIG. 1) provided on the side surfaces of the laminate.

Inside the laminated substrate 2, the internal electrodes 4a, 4b, 4c and 4d each forming a coil pattern are provided between the insulating layers 2a and 2b, between the insulating layers 2b and 2c, between the insulating layers 2c and 2d, and between the insulating layers 2d and 2e, respectively, and the internal electrode 4a provided between the insulating layers 2a and 2b and the internal electrode 4d provided between the insulating layers 2d and 2e are connected to the external electrode 3a (shown in FIG. 1) and the external electrode 3b (shown in FIG. 1), respectively.

In addition, the internal electrode 4a provided between the insulating layers 2a and 2b is electrically connected to the internal electrode 4b provided between the insulating layers 2b and 2c through a via hole (not shown) formed in the insulating layer 2b. In a manner similar to the above, the internal electrodes 4b and 4c are connected to each other through a via hole (not shown) formed in the insulating layer 2c, and the internal electrodes 4c and 4d are electrically connected to each other through a via hole (not shown) formed in the insulating layer 2d.

Next, a method for manufacturing this chip coil 1 will be described.

(1) By using the photosensitive conductive paste of the present invention (such as the photosensitive conductive paste according to the embodiment described above), a desired conductive pattern is formed on the insulating layer (insulating substrate) 2a composed of alumina or the like by a photosensitive paste method. After degreasing, the conductive pattern is fired in, for example, an air atmosphere at 850° C. for approximately 1 hour, thereby forming the spiral-shaped internal electrode 4a.

(2) Next, by using a photosensitive conductive paste containing powdered glass as an inorganic powder, an insulating paste layer is formed on the insulating substrate 2a provided with the internal electrode 4a by a photosensitive paste method. In this insulating paste layer, a via hole pattern having a diameter of, for example, 50 μm is formed by a photosensitive paste method. In addition, firing is performed in the air at a predetermined temperature, thereby forming the insulating layer 2b provided with a through-hole (not shown) for forming a via hole.

(3) Subsequently, after a conductive paste is filled into the through-hole for forming a via hole and is then dried to form the via hole (not shown) which connects one end of the internal electrode 4a to one end of the internal electrode 4b, in a manner similar to that for forming the internal electrode 4a in the above (1), a spiral-shaped internal electrode 4b is formed.

(4) Next, similarly to the above, the insulating layer 2c, the internal electrode 4c, the insulating layer 2d and the internal electrode 4d are formed. In addition, the protective insulating layer 2e is formed, and the external electrodes 3a and 3b are further provided, thereby forming the chip coil 1, as shown in FIG. 1, having a structure in which the internal electrodes and the insulating layers are laminated to each other.

Since the photosensitive conductive paste of the present invention is unlikely to gel and has good sensitivity to exposing light, when a conductive pattern is formed by using the photosensitive conductive paste of the present invention as described above, a conductive pattern (such as a circuit or an electrode) having high shape accuracy and high wiring density can be formed, and as a result, a compact and high-performance circuit element can be efficiently manufactured.

In addition to the chip coils, for example, the present invention can be applied to a high-frequency electronic element such as a chip capacitor or a chip LC filter, or a high-frequency circuit element such as a high-frequency module (VCO (Voltage Controlled Oscillator), PLL (Phase Locked Loop), or the like).

Next, a ceramic multilayer element formed by using the photosensitive conductive paste of the present invention will be described with reference to FIG. 3.

Figure 3:
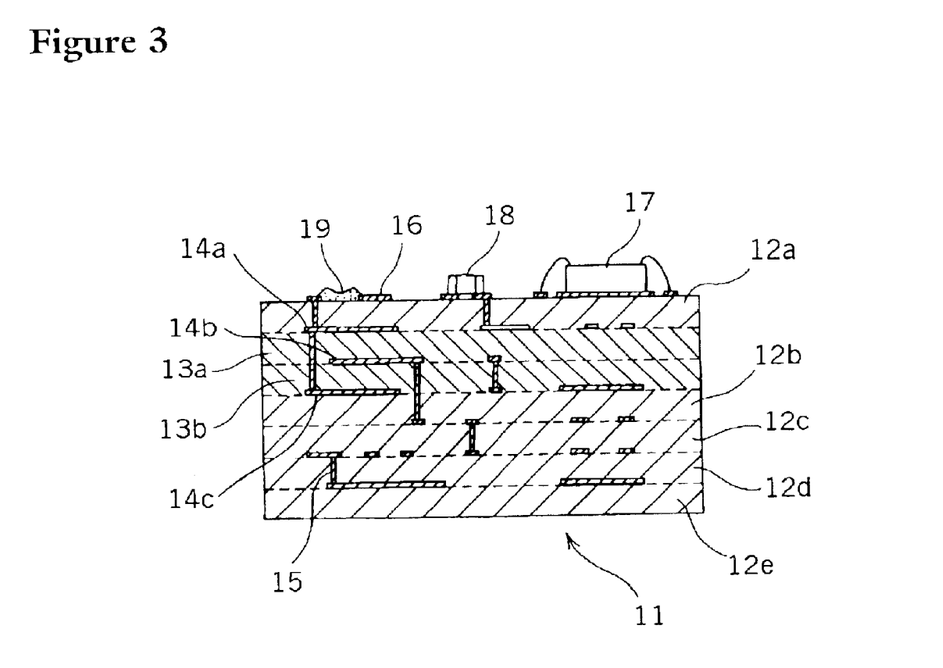
FIG. 3 is a schematic cross-sectional view showing a ceramic multilayer substrate according to an embodiment of the present invention.

A ceramic multilayer substrate 11 shown in FIG. 3 is a base body of a ceramic multilayer element formed by laminating insulating layers 12a, 12b, 12c, 12d and 12e, and dielectric layers 13a and 13b to each other. Inside the ceramic multilayer substrate 11, a capacitor pattern, a coil pattern, a strip line, and the like are formed by interlayer conductive patterns 14a, 14b and 14c and a via hole 15. In addition, on one major surface of the ceramic multilayer substrate 11, a semiconductor IC 17, a chip element 18 such as a chip capacitor, a thick-film resistor 19, and the like are provided and are each connected to a surface conductive pattern 16, or the interlayer conductive patterns 14a, 14b or 14c.

Next, a method for manufacturing this ceramic multilayer substrate 11 will be described.

(1) By using a photosensitive conductive paste containing a conductive powder as an inorganic powder, insulating ceramic green sheets and dielectric ceramic green sheets, which are provided with desired patterns thereon, are first formed by a photosensitive paste method.

(2) Next, after the ceramic green sheets provided with the conductive patterns thereon and via holes therein are laminated to each other and are bonded together by compression, firing is performed at a predetermined temperature.

(3) Subsequently, in a manner similar to that in the above (1), after the surface conductive pattern 16 is formed by a photosensitive paste method, the chip element 18 and the semiconductor IC 17 are mounted, and the thick-film resistor 19 is printed.

Accordingly, the ceramic multilayer substrate 11 having the structure shown in FIG. 3 can be obtained.

According to the manufacturing method described above, since the interlayer conductive patterns 14a, 14b and 14c and the surface conductive pattern 16 are formed by the pattern-forming method according to the present invention using a photosensitive paste method, uniform and fine conductive patterns can be formed.

In addition to electronic elements, such as a chip capacitor or a chip LC filter, used for high-frequency circuits, for example, the ceramic multilayer substrate may be applied to a high-frequency circuit substrate such as a high-frequency module (VCO (Voltage Controlled Oscillator), PLL (Phase Locked Loop), or the like.

The present invention is not limited to the embodiments described above and may be changed or modified without departing from the spirit and the scope of the present invention.

EXAMPLES

Hereinafter, the present invention will be described with reference to particular examples.

Example 1

As powdered base metals (powdered copper), an organic binder, a monomer having reactive functional groups, photopolymerization initiators, organic solvents, polyvalent alcohols, an ultraviolet absorber, and microparticles having anion-absorbing properties, the following materials listed below were prepared.

Powdered Base Metal (a) Powdered Copper A: Powdered copper processed by oxidation treatment on the surface thereof at 200° C. and 70% RH in an air atmosphere for 10 hours.

(An oxygen content of 0.5 wt %, an average particle diameter of 3 μm, and a spherical shape)

(b) Powdered Copper B: Powdered copper covered with CuO formed by spraying powdered CuO having a particle diameter of 0.1 μm or less on the surface of the powdered copper.

(An oxygen content of 0.5 wt %, an average particle diameter of 3 μm, and a spherical shape)

(c) Powdered Copper C: Powdered copper having no oxidation treatment.

(An oxygen content of 0.2 wt %, an average particle diameter of 3 μm, and a spherical shape)

(d) Powdered Copper D: Powdered copper processed by oxidation treatment on the surface thereof at 200° C. and 70% RH in an oxygen-containing atmosphere.

(An oxygen content of 0.3 wt %, an average particle diameter of 3 μm, and a spherical shape)

(e) Powdered Copper E: Powdered copper processed by oxidation treatment on the surface thereof under the same conditions as those for powdered copper C.

(An oxygen content of 1.0 wt %, an average particle diameter of 3 μm, and a spherical shape)

(f) Powdered Copper F: Powdered copper processed by oxidation treatment on the surface thereof under the same conditions as those for powdered copper C.

(An oxygen content of 1.5 wt %, an average particle diameter of 3 μm, and a spherical shape)

Organic Binder

Polymer: An acrylic copolymer obtained by forming a copolymer of methacrylic acid and methyl methacrylate having a copolymer ratio of 25 to 75 (methacrylic acid to methyl methacrylate) on a weight basis and a subsequent step of performing an addition reaction between the copolymer thus formed and epoxycyclohexylmethyl methacrylate in an amount of 0.2 times that of the methacrylic acid on a molar basis.

(A weight average molecular weight of 20,000, and an acid value of 118)

Monomer having Reactive Functional Groups

Monomer: Trimethylolpropane triacrylate

Photopolymerization Initiator

Initiator A: 2-methyl-1-[4-(methylthio)phenyl]-2-morpholinopropane

Initiator B: 2,4-diethyl thioxanthone

Organic Solvent

Organic Solvent A: Pentamethylene glycol (diol compound)

Organic Solvent B: Ethyl carbitol acetate

Polyvalent Alcohol

Polyvalent alcohol A: Glucitol (6 hydroxyl groups per molecule)

Polyvalent alcohol B: Threitol (4 hydroxyl groups per molecule)

Polyvalent alcohol C: Glycerin (3 hydroxyl groups per molecule)

Ultraviolet Absorber

Ultraviolet Absorber: An azo-based red pigment

Microparticles having Anion-absorbing Properties

Hydroxyapatite

The materials described above were weighted, mixed and compounded by a three-roll mill, thereby forming samples 1 to 12 of photosensitive conductive pastes having the compositions shown in Table 1 below.

Next, samples 1 to 12 of the photosensitive conductive pastes were applied to alumina substrates by spin coating and were then dried at 100° C. for 1 hour, thereby forming coating films 20 μm thick.

Subsequently, after the coating films thus formed were held for 24 hours, an exposure treatment was performed. In Example 1, by using a mask having a pattern of lines and spaces at a ratio (line/space (L/S)) of 20 to 20 (μm), each sample was irradiated at an exposure amount of 250 mJ/cm$^2$ with light emitted from a high-pressure mercury lamp.

Next, development was performed using an aqueous sodium carbonate solution, thereby forming a pattern having an L/S ratio of 20/20 (μm).

Subsequently, after a degreasing treatment was performed, firing was performed at 900° C. in a nitrogen atmosphere, thereby forming a conductive pattern (copper pattern) having an L/S ratio of 10/30 (μm).

Next, the storing states (whether gelation occurs or not) of the individual samples were measured at 20° C. in an air atmosphere immediately after the preparation thereof and were also measured after 1 day, 3 days, 1 week, 2 weeks, 3 weeks, 4 weeks, 5 weeks and 6 weeks. Accordingly, the number of days (days for gelation) required for gelation was measured for each sample. The results are shown in Table 1.

Since samples 2, 4, and 5 did not contain a diol compound, the paste lifetimes thereof are short compared to that of sample 1. Since sample 3 did not contain microparticles having anion-absorbing properties, the paste lifetime was short compared to that of sample 1.

In addition, when sample 8 was compared to samples 1 and 10 to 12, it was understood that a superior effect of preventing gelation could be obtained when powdered copper was heated to room temperature or more in an oxygen-containing atmosphere. In addition, when samples 1 and 11 were compared to samples 10 and 12, it was understood that when the oxygen content in powdered copper was in the range of about 0.4 to 1.2 wt %, the effect of preventing gelation could be enhanced.

Furthermore, according to the comparison between samples 4 and 7 and between samples 2 and 5, it was understood that when a polyvalent alcohol having only three hydroxyl groups per molecule was used, the effect for preventing gelation could not be expected.

Example 2

As powdered base metals (powdered metal), an organic binder, a monomer having reactive functional groups, photopolymerization initiators, organic solvents, polyvalent alcohols, an ultraviolet absorber and microparticles having anion-absorbing properties, the same materials as those used in Example 1 were prepared, and in addition, as powdered glass, an organic solvent, a dispersing agent, and organic thixotropic agents, the following materials were also prepared.

TABLE 1

| Composition Characteristics | 1 | 2 | 3 | 4 | 5 | 6 | 7 | 8 | 9 | 10 | 11 | 12 |
|---|---|---|---|---|---|---|---|---|---|---|---|---|
| Powdered Copper A (g) | 15 | 15 | 15 | 15 | 15 | 15 | 15 | — | — | — | — | — |
| Powdered Copper B (g) | — | — | — | — | — | — | — | 15 | — | — | — | — |
| Powdered Copper C (g) | — | — | — | — | — | — | — | — | 15 | — | — | — |
| Powdered Copper D (g) | — | — | — | — | — | — | — | — | — | 15 | — | — |
| Powdered Copper E (g) | — | — | — | — | — | — | — | — | — | — | 15 | — |
| Powdered Copper F (g) | — | — | — | — | — | — | — | — | — | — | — | 15 |
| Polymer (g) | 2.0 | 2.0 | 2.0 | 2.0 | 2.0 | 2.0 | 2.0 | 2.0 | 2.0 | 2.0 | 2.0 | 2.0 |
| Monomer (g) | 1.0 | 1.0 | 1.0 | 1.0 | 1.0 | 1.0 | 1.0 | 1.0 | 1.0 | 1.0 | 1.0 | 1.0 |
| Initiator A (g) | 0.4 | 0.4 | 0.4 | 0.4 | 0.4 | 0.4 | 0.4 | 0.4 | 0.4 | 0.4 | 0.4 | 0.4 |
| Initiator B (g) | 0.1 | 0.1 | 0.1 | 0.1 | 0.1 | 0.1 | 0.1 | 0.1 | 0.1 | 0.1 | 0.1 | 0.1 |
| Organic Solvent A (g) | 5.0 | — | 5.0 | — | — | 5.0 | — | 5.0 | 5.0 | 5.0 | 5.0 | 5.0 |
| Organic Solvent B (g) | — | 5.0 | — | 5.0 | — | — | 5.0 | — | — | — | — | — |
| Polyvalent Alcohol A (g) | 0.1 | 0.1 | 0.1 | — | 0.1 | — | — | 0.1 | 0.1 | 0.1 | 0.1 | 0.1 |
| Polyvalent Alcohol B (g) | — | — | — | 0.1 | — | — | — | — | — | — | — | — |
| Polyvalent Alcohol C (g) | — | — | — | — | 5.0 | — | 5.0 | — | — | — | — | — |
| Ultraviolet Absorber (g) | 0.1 | 0.1 | 0.1 | 0.1 | 0.1 | 0.1 | 0.1 | 0.1 | 0.1 | 0.1 | 0.1 | 0.1 |
| Microparticles having anion-absorbing Properties (g) | 0.1 | 0.1 | — | 0.1 | 0.1 | 0.1 | 0.1 | 0.1 | 0.1 | 0.1 | 0.1 | 0.1 |
| Days for Gelation (days) | 42 | 28 | 35 | 28 | 28 | 1 | 1 | 7 | 1 | 14 | 42 | 21 |

In Table 1, since the powdered copper (powdered base metal) processed by surface oxidation treatment was used, and in addition, a polyvalent alcohol having at least four hydroxyl groups per molecule was used, the paste lifetimes of samples 1 to 5, 8, and 10 to 12 were increased.

In particular, sample 1 could be applied to an insulating substrate by spin coating and could be processed by a photolithographic method to form a pattern during a period from immediately after the preparation to 6 weeks thereafter. However, after 6 weeks from the preparation, gelation was observed. In contrast, in samples 6 and 7, since a polyvalent alcohol having at least four hydroxyl groups per molecule was not used, and sample 9 did not contain powdered copper (powdered base metal) processed by surface oxidation treatment, their paste lifetimes were considerably decreased.

Powdered Glass: $SiO_2$—$Bi_2O_3$—$B_2O_3$ glass (an average particle diameter of 3 μm, and a spherical shape)

Organic Solvent C: dipropylene glycol monomethyl ether

Dispersing Agent: FLOWLEN G600 (manufactured by KYOEISHA CHEMICAL Co., LTD)

Thixotropic Agent A: a poly(ether ester) surfactant (Disparlon 3600N manufactured by Kusumoto Chemicals, Ltd.)

Thixotropic Agent B: a fatty acid amid wax (Disparlon 6900-20X manufactured by Kusumoto Chemicals, Ltd.)

The materials described above were weighted, mixed, and compounded by a three-roll mill, thereby forming samples 13 to 33 of photosensitive conductive pastes having the compositions shown in Tables 2 and 3 below.

Next, the evaluation of each sample in a manner equivalent to that in Example 1 was conducted. The results are shown in Tables 2 and 3.

TABLE 2

| Composition Characteristics | Sample # | | | | | | | | |
|---|---|---|---|---|---|---|---|---|---|
| | 13 | 14 | 15 | 16 | 17 | 18 | 19 | 20 | 21 |
| Powdered Copper A (g) | 110 | 110 | 110 | 110 | 110 | 110 | 110 | 110 | 110 |
| Powdered Copper B (g) | — | — | — | — | — | — | — | — | — |
| Powdered Copper C (g) | — | — | — | — | — | — | — | — | — |
| Powdered Copper D (g) | — | — | — | — | — | — | — | — | — |
| Powdered Copper E (g) | — | — | — | — | — | — | — | — | — |
| Powdered Copper F (g) | — | — | — | — | — | — | — | — | — |
| Powdered Glass (g) | 3.4 | 3.4 | 3.4 | 3.4 | 3.4 | 3.4 | 3.4 | 3.4 | 3.4 |
| Polymer (g) | 6.0 | 6.0 | 6.0 | 6.0 | 6.0 | 6.0 | 6.0 | 6.0 | 6.0 |
| Monomer (g) | 6.0 | 6.0 | 6.0 | 6.0 | 6.0 | 6.0 | 6.0 | 6.0 | 6.0 |
| Initiator A (g) | 1.0 | 1.0 | 1.0 | 1.0 | 1.0 | 1.0 | 1.0 | 1.0 | 1.0 |
| Initiator B (g) | 0.1 | 0.1 | 0.1 | 0.1 | 0.1 | 0.1 | 0.1 | 0.1 | 0.1 |
| Organic Solvent A (g) | 15.0 | 15.0 | 15.0 | 15.0 | 15.0 | 15.0 | 15.0 | 15.0 | 15.0 |
| Organic Solvent C (g) | 15.0 | 15.0 | 15.0 | 15.0 | 15.0 | 15.0 | 15.0 | 15.0 | 15.0 |
| Polyvalent Alcohol A (g) | — | — | — | — | — | — | — | — | — |
| Polyvalent Alcohol B (g) | — | — | — | — | — | — | — | — | — |
| Polyvalent Alcohol C (g) | — | — | — | — | — | — | — | — | — |
| Thixotropic Agent A (g) | 0.5 | — | 0.02 | 0.06 | 0.1 | 1.0 | 2.0 | 3.0 | — |
| Thixotropic Agent B (g) | — | 0.5 | — | — | — | — | — | — | — |
| Ultraviolet Absorber (g) | 0.1 | 0.1 | 0.1 | 0.1 | 0.1 | 0.1 | 0.1 | 0.1 | 0.1 |
| Microparticles having anion-absorbing properties (g) | — | — | — | — | — | — | — | — | — |
| Dispersing Agent (g) | 1.0 | 1.0 | 1.0 | 1.0 | 1.0 | 1.0 | 1.0 | 1.0 | 1.0 |
| Days for Gelation (days) | 42 | 2 | 7 | 42 | 42 | 42 | 42 | 21 | 1 |

TABLE 3

| Composition Characteristics | Sample # | | | | | | | | | | | |
|---|---|---|---|---|---|---|---|---|---|---|---|---|
| | 22 | 23 | 24 | 25 | 26 | 27 | 28 | 29 | 30 | 31 | 32 | 33 |
| Powdered Copper A (g) | — | — | — | — | — | 110 | 110 | 110 | 110 | 110 | 110 | 110 |
| Powdered Copper B (g) | 110 | — | — | — | — | — | — | — | — | — | — | — |
| Powdered Copper C (g) | — | 110 | — | — | — | — | — | — | — | — | — | — |
| Powdered Copper D (g) | — | — | 110 | — | — | — | — | — | — | — | — | — |
| Powdered Copper E (g) | — | — | — | 110 | — | — | — | — | — | — | — | — |
| Powdered Copper F (g) | — | — | — | — | 110 | — | — | — | — | — | — | — |
| Powdered Glass (g) | 3.4 | 3.4 | 3.4 | 3.4 | 3.4 | 3.4 | 3.4 | 3.4 | 3.4 | 3.4 | 3.4 | 3.4 |
| Polymer (g) | 6.0 | 6.0 | 6.0 | 6.0 | 6.0 | 6.0 | 6.0 | 6.0 | 6.0 | 6.0 | 6.0 | 6.0 |
| Monomer (g) | 6.0 | 6.0 | 6.0 | 6.0 | 6.0 | 6.0 | 6.0 | 6.0 | 6.0 | 6.0 | 6.0 | 6.0 |
| Initiator A (g) | 1.0 | 1.0 | 1.0 | 1.0 | 1.0 | 1.0 | 1.0 | 1.0 | 1.0 | 1.0 | 1.0 | 1.0 |
| Initiator B (g) | 0.1 | 0.1 | 0.1 | 0.1 | 0.1 | 0.1 | 0.1 | 0.1 | 0.1 | 0.1 | 0.1 | 0.1 |
| Organic Solvent A (g) | 15.0 | 15.0 | 15.0 | 15.0 | 15.0 | — | — | — | — | — | 15.0 | — |
| Organic Solvent C (g) | 15.0 | 15.0 | 15.0 | 15.0 | 15.0 | 15.0 | 15.0 | 15.0 | 15.0 | 15.0 | 15.0 | 15.0 |
| Polyvalent Alcohol A (g) | — | — | — | — | — | — | 1.0 | — | — | 1.0 | 1.0 | — |
| Polyvalent Alcohol B (g) | — | — | — | — | — | — | — | 1.0 | — | — | — | — |
| Polyvalent Alcohol C (g) | — | — | — | — | — | — | — | — | 15.0 | 15.0 | — | — |
| Thixotropic Agent A (g) | 0.5 | 0.5 | 0.5 | 0.5 | 0.5 | 0.5 | 0.5 | 0.5 | 0.5 | 0.5 | 0.5 | 0.5 |
| Thixotropic Agent B (g) | — | — | — | — | — | — | — | — | — | — | — | — |
| Ultraviolet Absorber (g) | 0.1 | 0.1 | 0.1 | 0.1 | 0.1 | 0.1 | 0.1 | 0.1 | 0.1 | 0.1 | 0.1 | 0.1 |
| Microparticles having anion-absorbing properties (g) | — | — | — | — | — | — | — | — | — | — | — | 1.0 |
| Dispersing Agent (g) | 1.0 | 1.0 | 1.0 | 1.0 | 1.0 | 1.0 | 1.0 | 1.0 | 1.0 | 1.0 | 1.0 | 1.0 |
| Days for Gelation (days) | 7 | 1 | 14 | 42 | 21 | 28 | 42 | 42 | 28 | 42 | 56 | 35 |

In Tables 2 and 3, since the powdered copper (powdered base metal) processed by surface oxidation treatment was used, and in addition, a poly(ether ester) surfactant was contained, the paste lifetimes of samples 13, 15 to 20, 22, and 24 to 33 were increased.

In particular, a diol compound and a polyvalent alcohol having at least four hydroxyl groups per molecule were contained in sample 32, in addition to the poly(ether ester) surfactant, and the paste lifetime was most increased.

In contrast, in samples 14 and 21, since a poly(ether ester) surfactant was not used, and sample 23 did not contain powdered copper (powdered base metal) processed by surface oxidation treatment, their paste lifetimes were considerably decreased.

In samples 15 and 20, since the content of a poly(ether ester) surfactant was less than about 0.05 parts by weight or was more than about 2 parts by weight with respect to 100 parts by weight of powdered copper, their paste lifetimes were short compared to those of sample 13, and 16 to 19.

When sample 22 was compared to samples 13 and 24 to 26, it was understood that a superior effect of preventing gelation could be obtained when powdered copper was heated to room temperature or more in an oxygen-containing atmosphere.

When samples 13 and 25 were compared to samples 24 and 26, the oxygen content in powdered copper was preferably in the range of about 0.3 to 1.5 wt %, and in addition, when the oxygen content in powdered copper was in the range of about 0.4 to 1.2 wt %, a superior effect of preventing gelation could be obtained.

According to the comparison between samples 28 and 30 and between samples 28 and 31, it was understood that when a polyvalent alcohol having only three hydroxyl groups per molecule was used, the effect of preventing gelation could not be expected.

When sample 27 and 33 were compared to each other, it was understood that due to the presence of microparticles having anion-absorbing properties, the effect of preventing gelation could be enhanced.

Since the material for forming microgels by reaction with metal hydroxides present on the surface of the powdered base metal is contained in addition to the powdered base metal processed by surface oxidation treatment in the photosensitive conductive paste of the present invention, gelation of the paste before application and gelation of the film obtained therefrom by application and drying can be sufficiently suppressed. Accordingly, a fine and thick conductive pattern can be efficiently formed by using the photosensitive conductive paste of the present invention.

In addition, when a polyvalent alcohol having at least four hydroxyl groups per molecule is used as the material for forming microgels by reaction with metal hydroxides present on the surface of the powdered base metal, the formation of microgels is facilitated, and hence, gelation of the photosensitive conductive paste can be prevented.

In addition, when a poly(ether ester) surfactant is used as the material for forming microgels by reaction with metal hydroxides present on the surface of the powdered base metal, the formation of microgels is facilitated, and hence, gelation of the photosensitive conductive paste can be prevented.

When the content of the poly(ether ester) surfactant is in the range of about 0.05 to 2 parts by weight, the microgels grow and conversely prevent the photosensitive conductive paste from being likely to gel, and hence, a sufficient effect of preventing gelation can be obtained.

According to the present invention, as the powdered base metal, various metals may be used; even when Cu, Mo, Ni, W, or an alloy containing at least one of the metals mentioned above is used, a photosensitive conductive paste, which is sufficiently prevented from gelling and can be formed into a fine and thick conductive pattern, can be reliably obtained.

In addition, when a powdered base metal which is heated to room temperature or more in an oxide-containing atmosphere is used, a photosensitive conductive paste containing the powdered base metal, which is reliably processed by oxidation treatment on the surface thereof, and having desired properties can be obtained, and hence, the advantages of the present invention can be effectively obtained.

As a method for performing surface oxidation treatment of powdered base metals, since the state of a base metal oxide on the surface of the powdered base metal can be easily controlled, and a dense base metal oxide film can be formed thereon, the method for performing heating in an oxygen-containing atmosphere is preferable.

In addition, when the oxygen content in the powdered base metal is controlled in the range of about 0.4 to 1.2 wt %, the surface of the powdered base metal is sufficiently covered with the oxide without making the base metal oxide film brittle due to an excessive oxygen content, and hence, the effect of preventing gelation can be reliably obtained.

In addition, by using an acrylic copolymer having carboxylic groups as the organic binder, development can be performed using water or an aqueous alkaline solution while gelation is suppressed. Furthermore, this type of organic binder may be effectively used as a photosensitive organic binder.

In the case in which an organic binder is used having unsaturated bonds formed by addition reaction of the carboxyl groups of an acrylic copolymer and an unsaturated glycidyl compound, the sensitivity to exposing light can be increased, and hence, the advantages of the present invention can be more effectively obtained.

In addition, in the case in which a diol compound is used, since the diol compound forms hydrogen bonds with metal hydroxides present on the surface of the powdered base metal and interferes with the formation of bonds between the metal hydroxides and acidic groups of the organic binder, gelation can be more reliably suppressed.

In the case in which a polyvalent metal component is contained in a photosensitive conductive paste, gelation may occur by reaction between the polyvalent metal component and acidic groups of the organic binder in some cases; however, since a material having anion-absorbing properties forms bonds with the acidic groups of the organic binder and interferes with the formation of bonds between metal hydroxides and the acidic groups of the organic binder, gelation can be more reliably suppressed.

In addition, in the case in which at least one selected from the group consisting of hydroxyapatite, hydrotalcite, zirconium phosphate, or hydrated antimony oxide is used as the material having anion-absorbing properties, the reaction between the polyvalent metal component and the acidic groups of the organic binder can be efficiently suppressed, and hence, gelation can be more reliably suppressed.

In the method for forming a conductive pattern, according the present invention, since the conductive pattern is formed by using the photosensitive conductive paste of the present invention, which is unlikely to gel, a circuit element provided with a conductive pattern (such as a circuit or an electrode) having high accuracy and density, which could not be realized by a conventional photosensitive conductive paste, can be obtained.

In another method for forming a conductive pattern, according to the present invention, since the photosensitive conductive paste of the present invention is used, gelation of the photosensitive conductive paste and gelation of the film obtained therefrom by application and drying can be suppressed, and a desired pattern can be formed on the substrate by a transfer method. As a result, a circuit element provided with a conductive pattern (such as a circuit or an electrode) having high accuracy and density, which could not be realized by a conventional photosensitive conductive paste, can be efficiently manufactured.

Since the circuit element of the present invention is formed in accordance with the method for manufacturing the conductive pattern according to the present invention, a thick pattern having high shape and dimensional accuracy can be obtained. Accordingly, a compact and high-performance circuit element can be provided.

In addition, according to the method of the present invention for manufacturing the ceramic multilayer element, since the conductive pattern is formed from the photosensitive conductive paste of the present invention, which is unlikely to gel, a ceramic multilayer element provided with a conductive pattern (such as a circuit or an electrode) having high accuracy and density, which could not be realized by a conventional photosensitive conductive paste, can be efficiently manufactured.

Furthermore, according to the method of the present invention for manufacturing the ceramic multilayer element, since the photosensitive conductive paste of the present invention is used, desired patterns can be formed on ceramic green sheets by a transfer method while gelation of the photosensitive conductive paste and gelation of the film obtained therefrom by application and drying are suppressed, and when a laminate composed of the ceramic green sheets is fired, a ceramic multilayer component provided with a conductive pattern (such as a circuit or an electrode) having high accuracy and density, which could not be realized by a conventional photosensitive conductive paste, can be efficiently manufactured.

What is claimed is:

1. A photosensitive conductive paste comprising:
   a powdered base metal having an oxidized surface and thereby metal hydroxides thereon;
   an organic binder having acidic groups;
   a photosensitive organic component; and
   a material which forms microgels by reaction with metal hydroxides present on the surface of the powdered base metal;
   wherein the material forming the microgels comprises a polyvalent alcohol having at least 4 hydroxyl groups per molecule and a poly(ether ester) surfactant.

2. A photosensitive conductive paste comprising:
   a powdered base metal having an oxidized surface and thereby metal hydroxides thereon;
   an organic binder having acidic groups;
   a photosensitive organic component; and
   a material which forms microgels by reaction with metal hydroxides present on the surface of the powdered base metal;
   wherein the material forming the microgels comprises a poly(ether ester) surfactant.

3. The photosensitive conductive paste according to claim 2, wherein about 0.05 to 2 parts by weight of the poly(ether ester) surfactant is present with respect to 100 parts by weight of the powdered base metal.

4. The photosensitive conductive paste according to claim 2, wherein the powdered base metal is at least one selected from the group consisting of copper, molybdenum, nickel, tungsten, and an alloy containing at least one of these metals.

5. The photosensitive conductive paste according to claim 2, wherein a powdered base metal which was heated to room temperature or more in an oxygen-containing atmosphere for surface oxidation treatment is used as the powdered base metal.

6. The photosensitive conductive paste according to claim 2, wherein the powdered base metal contains oxygen at a concentration of about 0.4 to 1.2 wt %.

7. The photosensitive conductive paste according to claim 2, wherein the organic binder having acidic groups comprises an acrylic copolymer having carboxyl groups.

8. The photosensitive conductive paste according to claim 7, wherein the organic binder having acidic groups has unsaturated bonds which are the addition reaction product of carboxyl groups and an unsaturated glycidyl compound.

9. The photosensitive conductive paste according to claim 7, wherein the powdered base metal is at least one selected from the group consisting of copper, molybdenum, nickel, tungsten, and an alloy containing at least one of these metals;
   wherein a powdered base metal which was heated to room temperature or more in an oxygen-containing atmosphere for surface oxidation treatment is used as the powdered base metal;
   wherein the powdered base metal contains oxygen at a concentration of about 0.4 to 1.2 wt %.

10. The photosensitive conductive paste according to claim 2, further comprising a diol.

11. A photosensitive conductive paste comprising;
    a powdered base metal having an oxidized surface and thereby metal hydroxides thereon;
    an organic binder having acidic groups;
    a photosensitive organic component; and
    a material which forms microgels by reaction with metal hydroxides present on the surface of the powdered base metal; and further comprising a material having anion-absorbing properties.

12. The photosensitive conductive paste according to claim 11, wherein the material having anion-absorbing properties comprises at least one selected from the group consisting of hydroxyapatite, hydrotalcite, zirconium phosphate and hydrated antimony oxide.

13. The photosensitive conductive paste according to claim 12, wherein the material forming the microgels comprises a combination of a poly(ether ester) surfactant and a polyol having at least 4 hydroxyls, the powdered base metal contains oxygen at a concentration of about 0.4 to 1.2 wt % and is at least one selected from the group consisting of copper, molybdenum, nickel, tungsten, and an alloy containing at least one of these metals, and wherein the organic binder having acidic groups is an unsaturated addition reaction product of an acrylic polymer having carboxyl groups and an unsaturated glycidyl compound.

14. The photosensitive conductive paste according to claim 11, wherein the powdered base metal is at least one selected from the group consisting of copper, molybdenum, nickel, tungsten, and an alloy containing at least one of these metals.

15. The photosensitive conductive paste according to claim 11, wherein a powdered base metal which was heated to room temperature or more in an oxygen-containing atmosphere for surface oxidation treatment is used as the powdered base metal.

16. The photosensitive conductive paste according to claim 11, wherein the powdered base metal contains oxygen at a concentration of about 0.4 to 1.2 wt %.

17. The photosensitive conductive paste according to claim 11, wherein the organic binder having acidic groups comprises an acrylic copolymer having carboxyl groups.

18. The photosensitive conductive paste according to claim 11, wherein the organic binder having acidic groups has unsaturated bonds which are the addition reaction product of carboxyl groups and an unsaturated glycidyl compound.

19. The photosensitive conductive paste according to claim 11, further comprising a diol.

20. The photosensitive conductive paste according to claim 11, wherein the powdered base metal is at least one selected from the group consisting of copper, molybdenum, nickel, tungsten, and an alloy containing at least one of these metals;

wherein a powdered base metal which was heated to room temperature or more in an oxygen-containing atmosphere for surface oxidation treatment is used as the powdered base metal;

wherein the powdered base metal contains oxygen at a concentration of about 0.4 to 1.2 wt %.

* * * * *